United States Patent
Wu et al.

[11] Patent Number: 6,052,879
[45] Date of Patent: Apr. 25, 2000

[54] METHOD FOR EMBEDDING PIEZOELECTRIC TRANSDUCERS IN THERMOPLASTIC COMPOSITES

[75] Inventors: Shu-Yau Wu, Artesia; Creed E. Blevins, Aliso Viejo, both of Calif.

[73] Assignee: McDonnell Douglas Corporation, Huntington Beach, Calif.

[21] Appl. No.: 09/288,206

[22] Filed: Apr. 8, 1999

Related U.S. Application Data

[62] Division of application No. 08/711,029, Sep. 9, 1996, Pat. No. 5,920,145.

[51] Int. Cl.$^7$ .................................................. H01L 41/22
[52] U.S. Cl. ............................................ 29/25.35; 29/856
[58] Field of Search .................................. 29/25.35, 856; 310/328, 330–332, 340, 346, 363–366

[56] References Cited

U.S. PATENT DOCUMENTS

| | | |
|---|---|---|
| 2,386,692 | 10/1945 | Kuenster . |
| 3,230,402 | 1/1966 | Nightingale et al. . |
| 3,747,176 | 7/1973 | Toyoshima . |
| 4,445,256 | 5/1984 | Huguenin et al. . |
| 4,849,668 | 7/1989 | Crawley et al. . |
| 4,958,100 | 9/1990 | Crawley et al. . |
| 5,305,507 | 4/1994 | Dvorsky et al. . |
| 5,369,862 | 12/1994 | Kotani et al. . |
| 5,374,011 | 12/1994 | Lazarus et al. . |
| 5,424,596 | 6/1995 | Mendenhall et al. . |
| 5,520,056 | 5/1996 | Buisson et al. . |
| 5,525,853 | 6/1996 | Nye et al. . |
| 5,656,882 | 8/1997 | Lazarus et al. . |

FOREIGN PATENT DOCUMENTS 0135213  5/1989  Japan .

Primary Examiner—Carl E. Hall
Attorney, Agent, or Firm—Alston & Bird LLP

[57] ABSTRACT

A method for embedding piezoelectric ceramic transducers in thermoplastic composites. The piezoelectric ceramic transducer to be embedded in a graphite/PEEK composite is first bonded with two fine silver wires for electrical connection, one on each major surface. The bonding agent is a high temperature conductive adhesive compound, such as a silver/glass frit. The fusing of the frit bonding agent is done in an over at a high temperature (i.e. 600° F. or higher) for 5 to 10 minutes. Bonds are applied at several discrete spots on the zig zag wire which relieves thermal stresses induced during cooling due to a mismatch of the coefficient of thermal expansion between the ceramic material and the wire. After the connecting wires are attached, the wires and transducer are wrapped with several plies of insulating glass/PEEK cloth to prevent electrical shorting between the two silver wires through the graphite/PEEK host. The insulating glass cloth and tube sheaths are impregnated with PEEK resin to improve the bonding to the surrounding structural materials. To compensate for non-uniform stresses and prevent the composite plate from warping or distorting during the consolidation process, a compensating layer made from several plies of the same glass/PEEK cloth used to wrap the ceramic transducer is placed under the cutouts on the opposite side of the plate/ply structure. When the consolidation is completed, the piezoelectric ceramic transducer is electrically poled with a high electric field (dependent on the specific ceramic material) at a temperature of around 200 to 350 degrees Fahrenheit, which repoles the ceramic transducer.

17 Claims, 4 Drawing Sheets

METHOD FOR EMBEDDING PIEZOELECTRIC TRANSDUCERS IN THERMOPLASTIC COMPOSITES

CROSS-REFERENCE TO RELATED APPLICATION

This application is a divisional application of U.S. patent application Ser. No. 08/711,029, filed on Sep. 9, 1996, now U.S. Pat. No. 5,920,145.

BACKGROUND OF THE INVENTION

1. Field of the Invention

The field of this invention relates piezoelectric ceramic transducers and embedding such piezoelectric transducers in composites. More specifically, this relates to a method for embedding piezoelectric ceramic transducers in thermoplastic composites which are much tougher and as strong and stiff as thermoset composite materials, but have a higher consolidation temperature.

2. Related Art

Piezoelectric ceramic transducers have found many important applications in adaptive structures for vibration control and acoustic noise suppression in modern space, civilian and military systems, such as launch vehicles, space platforms, aircraft, submarines and helicopters. These transducers may be attached to or imbedded in advanced composite materials to form adaptive structures that are light weight, strong, and affordable both in manufacturing costs and long operating life. There have been several programs supported by the government to develop technology for the manufacturing and processing of advanced adaptive structures built with advanced composite materials incorporating active devices such as sensors and actuators. The following are a few examples. These include those devices described in "Advanced Composites with Embedded Sensors and Actuators (ACESA)" by Boeing Aerospace and Electronics Division, Seattle, Wash., pursuant to Air Force Astronautic Laboratory Contract at Edwards Air Force Base, Calif., Contract F04611-88-C-0053; and a similar program by TRW Space & Technology Group in Redondo Beach, Calif., with the Astronautics Laboratory, Contract F04611-88-C-0054; and the "Synthesis and Processing of Intelligent, Cost Effective Structures (SPICES) Program" sponsored by the Advanced Research Projects Agency (ARPA), to develop cost effective, adaptive material processing and synthesis technologies for smart adaptive structures. In the first two of these programs, the transducer materials utilized were piezoelectric ceramics of lead-zirconate-titanate (PZT) and electrostrictive ceramics of lead-molybdenum-niobate (PMN). The transducers were bonded to or embedded in the host material. The host materials employed were low temperature graphite/epoxy thermoset composites, such as T300/934 (processing temperature in the range of 280° to 350° F.). Such graphite/epoxy materials have the following disadvantages: their toughness is low; they will outgas, and absorb moisture; and they are vulnerable to degradation due to atomic oxygen, ultra violet and other radiation as well as hostile threats. Also of interest is U.S. Pat. No. 5,305,507 to DVORSKY et. al. The DVORSKY Patent described the method of encapsulating piezoelectric actuators for easy embedding thereof or lamination into the composite structure.

In the SPICES program, two materials were used as the host composite materials. The first was a thermoset, fiberglass/epoxy and the second was a thermoplastic, AS4/PEEK composite. The fiberglass/epoxy composites, which are electrically nonconductive, have the same low toughness as the conductive graphite/epoxy used by others. The embedding of ceramic transducers was done by a resin transfer molding (RTM) method and the highest temperature the ceramic transducers were subjected to was during cure at about 250 degrees Fahrenheit. The second composite material, (AS4/PEEK), has a much higher toughness than the thermoset materials. It outgasses very little. The material has a potential for low-cost fabrication and for simplified joining. The processing temperature for PEEK using the traditional lay-up and autoclave consolidation method for thermoplastic materials was about 600 to 800 degrees Fahrenheit. In the SPICES program, the operation of embedding active transducers and the consolidation of the host ply material was done by a fiber placement process. In this process, the thermoplastic ply is heated by a laser, fed under compaction onto previous plies and completely consolidated to them in one step. The ceramic transducer was sandwiched between a titanium metal frame and loaded manually in a predesigned cutout in the host material. The transducer was then covered with a thin copper shield to protect it from laser exposure every time the laser hit the composite ply tape over it during the tape laying and consolidating steps. Ceramic transducers so processed have a very loose electromechanical coupling with the host AS4/PEEK composite, likely due to the method used to embed the ceramic transducers. Results from piezoelectric shunt-damping tests indicated that the transducer's coupling coefficient was very low. When transducers were used as actuators for passive damping control, the measured resonant amplitude reduction was only a few decibels. When they were used as actuators for active vibration control, the signal was so low that a high gain amplifier was required to increase it. Low control authority of transducers was attributed to poor electromechanical coupling between the transducer and the host composite when ceramic transducers were embedded in the AS4/PEEK thermoplastic composite by the fiber placement process.

BRIEF DESCRIPTION OF THE INVENTION

The method of this invention for embedding piezoelectric ceramic transducers in thermoplastic composites (which are much tougher and as strong and stiff as the thermoset materials described above) is different from the related art in that the composite structures in the above-identified methods, (including specifically U.S. Pat. No. 5,305,507 to DVORSKY), are made from thermoset materials whose cure temperature is low, about 280 to 350 degrees Fahrenheit. The thermoplastic materials used in this invention have a higher softening temperature than the thermoset materials. That is, the processing and consolidation temperature is usually higher than 700 degrees Fahrenheit, which is higher than the melting temperature of most common solders used for attaching wires. It is also a much higher temperature than a conductive epoxy, also used for bonding wires, can tolerate and in fact, it is higher than the Curie temperature of most piezoelectric ceramic transducer materials such as PZT and PMN. This high processing temperature will break the solder or conductive epoxy bond between the wire and the ceramic electrode when the bond is subjected to such a temperature level. It will also cause the electric polarization previously established in the ceramic device to dipole, or lose the piezoelectric property completely. Therefore, in order to embed a piezoelectric ceramic transducer in a thermoplastic composite, the prior methods used for embedding piezoelectric ceramic transducers in thermoset materials are ineffective for high temperature thermoplastic composite materials. In the instant invention, the process for embedding piezoelectric ceramic transducers in thermoplastic composites is conducted at a high temperature, i.e., a temperature higher than required for cure in the fiber placement process mentioned above. The consolidation of graphite/PEEK plies with ceramic transducers placed in cutouts in the laminate is done using a hot platen-press method or by using an autoclave with a consolidation temperature above 600 degrees Fahrenheit.

The piezoelectric ceramic transducer to be embedded in the graphite/PEEK composite is first bonded with two fine silver wires for electrical connection, one on each major surface. The bonding agent is a high temperature conductive adhesive compound, such as silver/glass frit. This high temperature bonding agent fuses at the high temperature required in the fabrication of the composite and remains firmly on the ceramic electrode throughout the entire composite consolidation process. The wires are formed in a zig zag shape or pattern prior to bonding on the ceramic. This is done in order to provide multiple areas of electrical contact and activity. The bonding agent is then applied on to the wire at several locations along the zig zag wire to ensure adequate connection during the high temperature composite consolidation process. The fusing of the frit bonding agent is done in an oven at high temperature (i.e. 600° F. or higher) for 5 to 10 minutes. Bonds are also applied at several discrete spots on the zig zag wire for the purpose of relieving thermal stresses induced during cooling due to a mismatch of coefficient of thermal expansion between the ceramic and the wire.

After the ceramic connecting wires are attached, the wires and the transducer are wrapped with several plies of insulating glass/PEEK cloth. The glass/PEEK insulating cloth prevents electrical shorting between the two silver electrodes through the graphite/PEEK host, which is electrically conductive. The remainder of the silver connecting wires which are not bonded to the ceramic are also insulated, using braided nonconducting glass tube sheaths. Both the insulating glass cloth and tube sheaths are impregnated with PEEK resin to improve the bonding to the surrounding structural materials. To compensate for non-uniform stresses and prevent the composite plate from warping or distorting during the consolidation process, a compensating layer made from several plies of the same glass/PEEK cloth used to wrap the ceramic is placed under the cutouts on the opposite side of the plate/ply structure. After the ply structure has been consolidated, the piezoelectric ceramic transducers are electrically poled with a high electric field (dependent on the specific ceramic material) at a temperature of around 200 to 350 degrees Fahrenheit, which repoles the ceramic after the composite consolidation process at the higher temperature of 720 degrees Fahrenheit or so and at a pressure of approximately 200 pounds per square inch. The thermoplastic composite is much tougher and as strong as the thermoset composite. Therefore, the material made from the former composite with an embedded piezoelectric ceramic transducer in it results in a more robust product than that made using thermoset composites. The thermoplastic composite also does not outgas and is far superior for use for aircraft, missile and space applications.

DESCRIPTION OF THE PREFERRED EMBODIMENT

The method and apparatus of this invention for embedding piezoelectric ceramic transducers in thermoplastic composites (which are much tougher and as strong and stiff as the thermoset materials) described above is different from the related art in that the related art composite structures are made from thermoset materials whose cure temperature is low, about 280 to 350 degrees Fahrenheit. The thermoplastic materials used in this invention have a higher softening temperature than most thermoset materials, in the range of 600° to 800° Fahrenheit. That is, the processing and consolidation temperature is higher than the melting temperature of most lead based solders used for attaching wires. It is also a much higher temperature than can be tolerated by conductive epoxy, also used for bonding wires. In fact, it is higher than the depoling temperature for most piezoelectric ceramic transducer materials made of PZT and PMN. In the instant invention, the process for embedding piezoelectric ceramic transducers in thermoplastic composites is conducted at such high temperatures, that is, a temperature higher than the fiber placement process mentioned above. The consolidation of graphite/PEEK plies with a ceramic transducer placed in a cutout and a laminate is done using the hot platen-press method or by using an autoclave with a consolidation temperature above 600° Fahrenheit.

Figure 1:
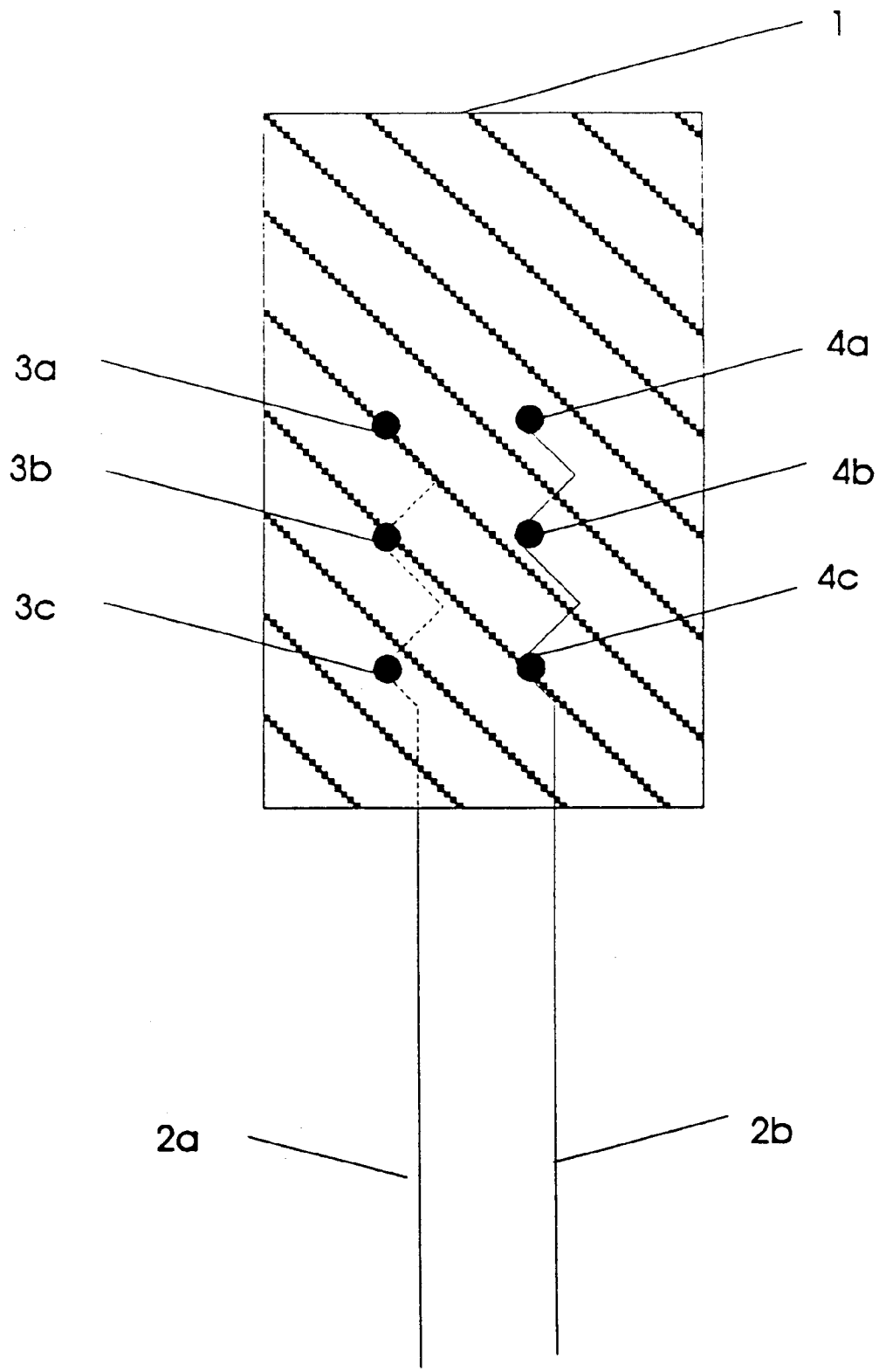
FIG. 1 shows the zig zag silver wires bonded on the PZT at discrete points.

As shown in FIG. 1, the piezoelectric ceramic transducer 1 to be embedded in the graphite/PEEK composite is first bonded with two fine silver wires 2a and 2b on either side of the ceramic to serve as electrical conductors. The bonding agent is a high temperature conductive adhesive compound, such as a silver/glass frit. This high temperature bonding agent fuses at the high temperature required in the fabrication of the composite and remains firmly in electrical and physical contact on the ceramic throughout the entire composite consolidation process. The wires 2a and 2b are formed into-a zig zag shape or other stress relieving pattern prior to bonding on the ceramic. This is done in order to provide multiple areas of electrical contact while providing stress relief. The bonding agent is applied on the wire at several locations along the zig zag wire to ensure adequate contact during the high temperature composite consolidation process. Bonds are applied at several discrete spots 3a, 3b and 3c and 4a, 4b and 4c, for example, on the zig zag wires to relieve thermal stresses induced during temperature changes due to a mismatch of coefficient of thermal expansion between the ceramic and the wire.

Figure 2:
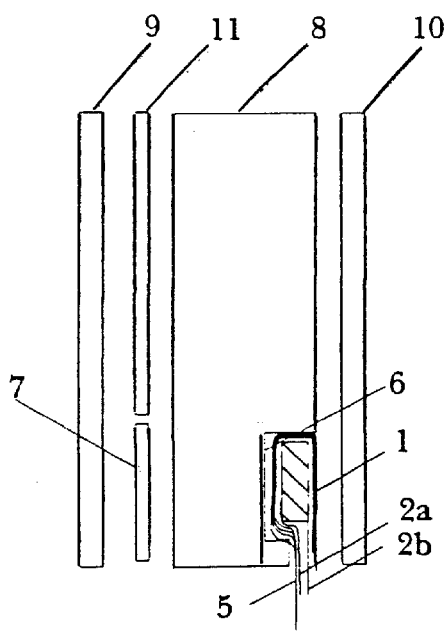
FIG. 2 shows a side view lay up arrangement of the composite plies with the PZT and the cutout before consolidation.
Figure 4:
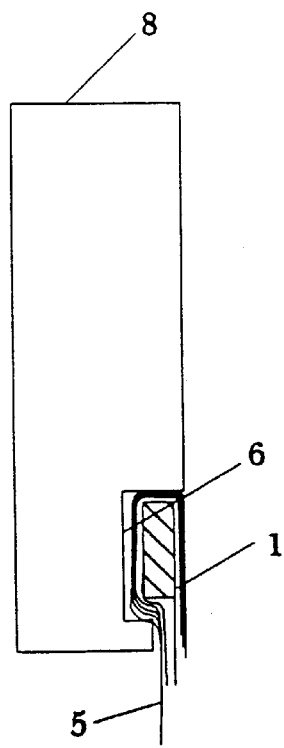
FIG. 4 shows a side view of the PZT ceramic wrapped with PEEK impregnated glass cloth.
Figure 5:
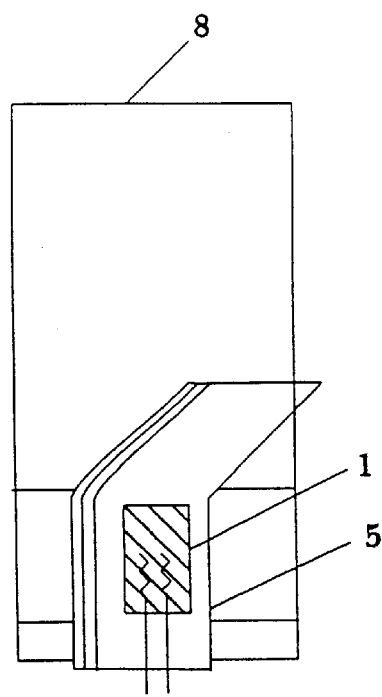
FIG. 5 shows a top view of the PZT ceramic transducer to be wrapped by a side view of the PEEK impregnated glass cloth.

After the ceramic connecting wires are attached, the wires and the transducer are wrapped with several plies of insulating glass/PEEK cloth 5 as shown in FIGS. 2, 4 and 5. These glass plies are impregnated or powder-coated with PEEK and folded around the ceramic transducer to insulate it. The glass/PEEK insulating cloth 5 prevents electrical shorting between the two silver electrodes 2a and 2b through the graphite/PEEK host, which is electrically conductive. The remainder of the silver connecting wires 2a and 2b which are not bonded to the ceramic transducer are also insulated with braided nonconducting glass tube sheaths (not shown) for the same reason. Both the insulating glass cloth and tube sheaths are impregnated with PEEK resin or powder coated to improve bonding to the surrounding structural materials. FIG. 2 shows the composite ply structure from the side view having a bottom layer 9, an intermediate layer 8 and a top layer 10.

Figure 3:
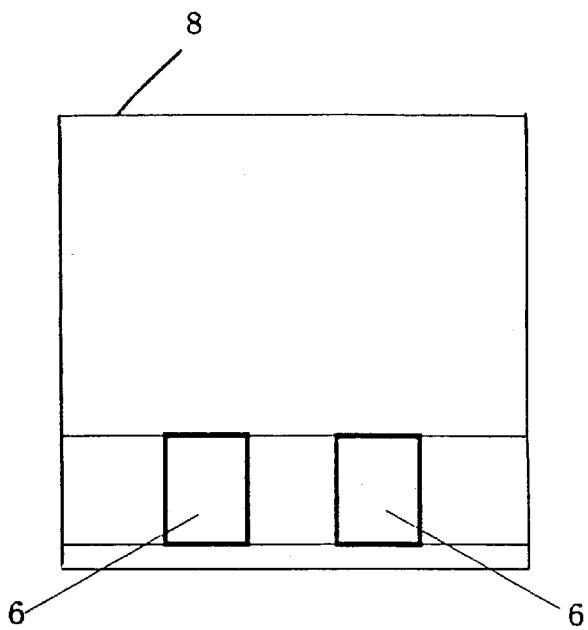
FIG. 3 shows a top view of the composite material with cutouts.

The intermediate layer 8 is provided with cutouts 6 for receiving the ceramic transducer and its glass/PEEK-wrap 5. There may be a plurality of such cutouts 6 as shown in FIG. 3. Such cutouts may be as much as seven layers deep. In the specific embodiment the cutouts are 2.3 inches by 0.75 inches by 0.035 inches in size.

To compensate for non-uniform stresses encountered due to the presence of the transducer and the hole 6 in the composite (which can be up to seven layers deep) and to prevent the composite plate from warping or distorting during the consolidation process, a compensating layer 7 made from several plies of the same glass/PEEK cloth used to wrap the ceramic transducer 1 is placed under the cutouts on the opposite side of the plate/ply structure 8 as shown in FIG. 2. An equal number of 5 mil glass/PEEK layers in the compensating layer is required to balance the plies wrapped around the ceramic transducer. In this particular case three plies of glass/PEEK cloth were wrapped around the ceramic transducer and six compensating plies were included in the compensating layer. The compensating plies are required to prevent the structure from warping during cooling. The supporting layer 11 is formed from several plies of the same graphite/PEEK material as the rest of the structure.

The entire composite package is then consolidated either by the hot platen-press method of compaction or by using an autoclave with consolidation temperatures above 600° Fahrenheit. In this particular case, a temperature of 720° Fahrenheit was used at 200 psi. The fusing of the frit bonding agent is done in an oven at a high temperature for 5 to 10 minutes. The silver/glass frit can be fused to the ceramic device at approximately 720° Fahrenheit. However, once fused, the bond will tolerate temperatures of up to 820° Fahrenheit without deteriorating. This is significantly higher than the bonding temperature of conductive epoxies or solders used in the related art methods. After the ply structure has been consolidated, the piezoelectric ceramic transducers are electrically poled with an electric field (for the specific ceramic material) at a temperature of around 200° to 350° Fahrenheit (sufficient to repole the ceramic transducer after the composite consolidation process at the higher temperature). This results in a thermoplastic composite which is much tougher and as strong and stiff as the thermoset composite. Adaptive structures made from the former composite with an embedded piezoelectric ceramic transducer are more robust than those made using thermoset composites. The thermoplastic composite does not outgas and is far superior for use in aircraft, missile and space applications.

Figure 6A:
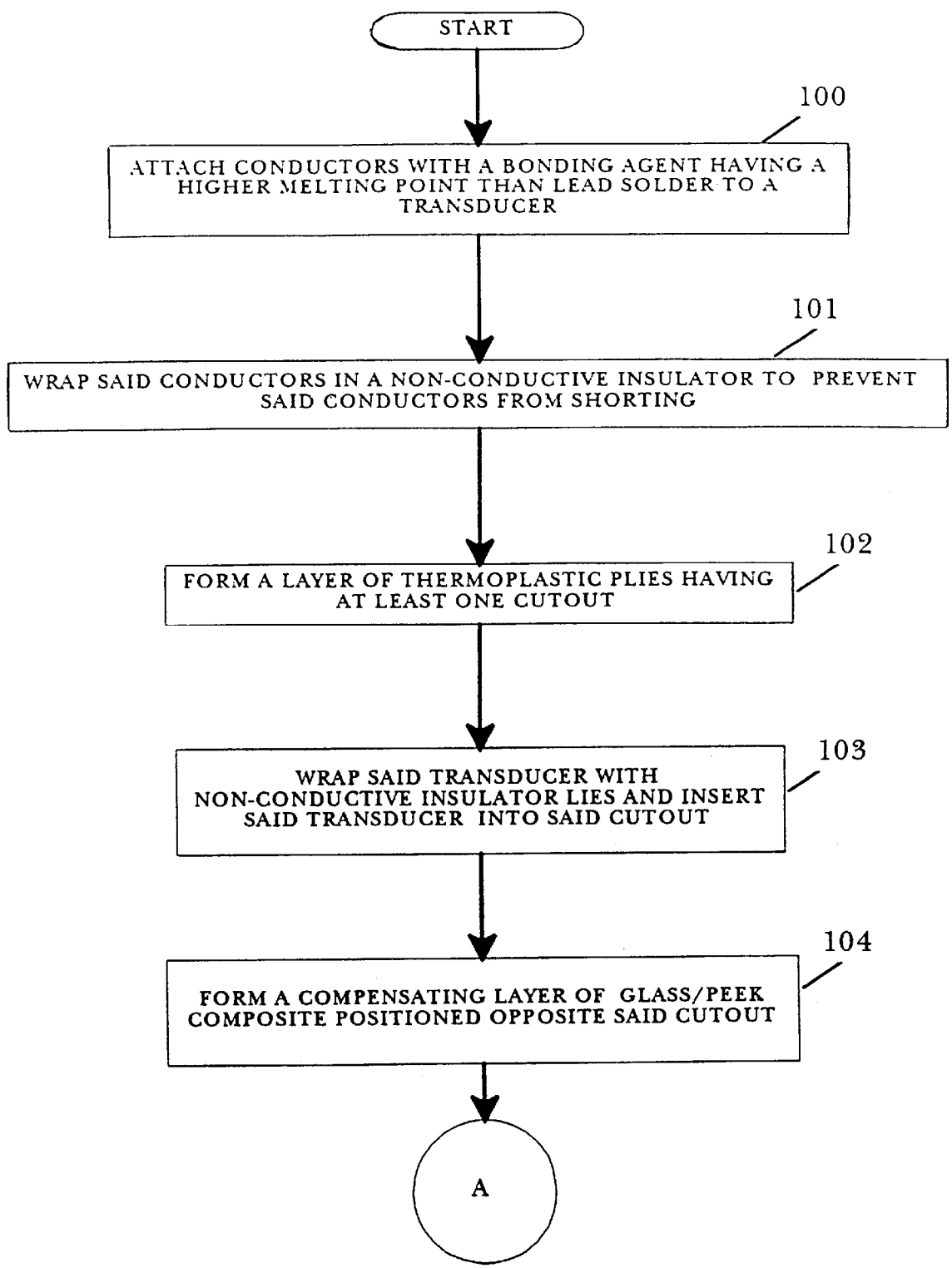
FIGS. 6A and 6B are a flow chart of the method of imbedding the ceramic transducer.
Figure 6B:
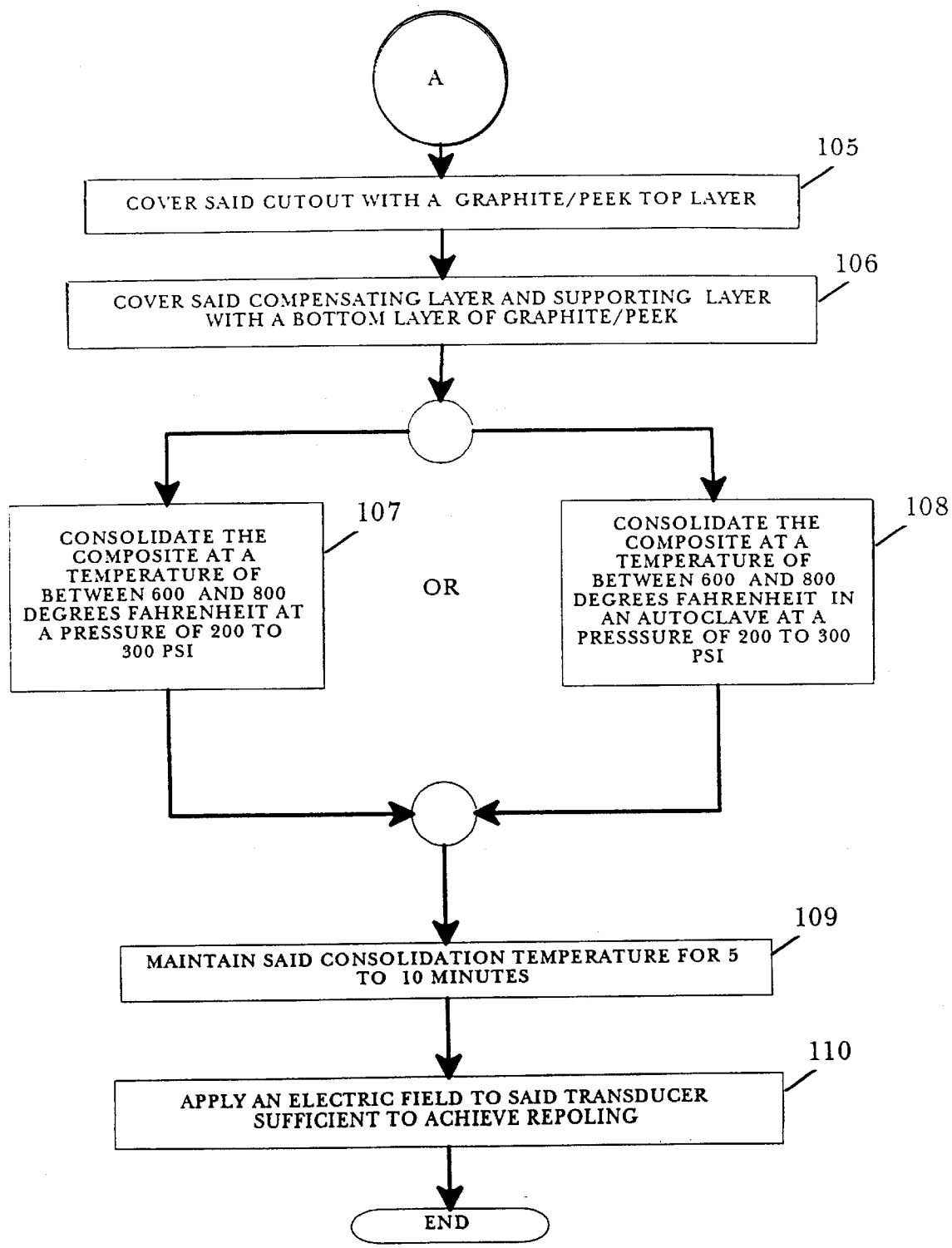

The specific process is as follows: With reference to FIG. 6a and 6b, using a bonding agent having a higher melting point than lead solder, the wire conductors are attached to a ceramic transducer, step 100. The conductors are, then wrapped with a non-conductive insulator to prevent the conductors from shorting, step 101. A layer of thermoplastic plies having at least one cutout for receiving the transducer wrapped in its insulating cover is formed, step 102. The transducer and its wrapper are inserted into the cutout, step 103. A compensating layer of glass/PEEK composite is positioned opposite to the cutout layer to prevent warping of the panel during cooling, step 104. The cutout is covered with a graphite/PEEK top layer, step 105. The bottom of the composite lay-up, is also covered by laying a bottom graphite/PEEK layer under the compensatory layer and the supporting layer, step 106. Consolidate the composite at a temperature between 600° to 800° Fahrenheit and at a pressure of 200 to 300 psi, step 107 or consolidate the composite at a temperature between 600° to 800° Fahrenheit in an autoclave, step 108. Maintain the consolidation temperature for five to ten minutes, step 109. Apply an electric field to the transducer at a temperature of around 200° to 350° Fahrenheit to achieve repoling, step 110.

What is claimed is:

1. A method for embedding a transducer in a composite material comprising the steps of:
    a. forming a first layer of composite material having first and second opposed sides;
    b. forming a recess in the first side of the first layer;
    c. inserting a transducer in the recess, wherein the transducer is located nearer to the first side of the first layer of composite material than the opposed second side of composite material;
    d. disposing an insulating layer between the transducer and the composite material;
    e. disposing a compensating layer on the second side of the composite material, wherein the compensating layer compensates for non-uniform stresses introduced into the material by the insulating layer; and
    f. consolidating the composite material at temperatures higher than for curing thermoset composite materials.

2. A method as described in claim 1 further comprising the steps of attaching conductors to said transducer using an adhesive conducting material.

3. A method for embedding a transducer in a composite material comprising the steps of:
    a. forming a first layer of composite material having first and second opposed sides;
    b. forming a recess in the first side of the first layer;
    c. inserting a transducer in the recess, wherein the transducer is located nearer to the first side of the first layer of composite material than the opposed second side of the composite material;
    d. attaching conductors to the transducer, wherein portions of the conductors are formed into stress relieving shapes;
    e. disposing an insulating layer between the transducer and the composite material;
    f. disposing a compensating layer on the second side of the composite material, wherein the compensating layer compensates for non-uniform stresses introduced into the material by the insulating layer; and
    g. consolidating the composite material at temperatures higher than for curing thermoset composite material.

4. A method as described in claim 1 wherein said consolidation temperature is higher than 350° Fahrenheit (176.67° Celsius).

5. A method as described in claim 1 wherein said consolidation temperature is within the range of 600° (315.56° Celsius) to 800° Fahrenheit (426.67° Celsius).

6. A method as described in claim 2, wherein said attaching step comprises attaching conductors to the transducer using adhesive conducting material having a higher melting point than the consolidation temperature of the composite structure.

7. A method as described in claim 2 further comprising the steps of
   a. heating the transducer with the attached conductors in an oven at the fusing temperature of said conducting material,
   b. timing said heating in said oven until said conducting material fuses said conductor with said transducer.

8. A method as described in claim 2 further comprising the steps of forming a portion of each of said conductors into stress relieving shapes and attaching said conductors to said transducer using an adhesive conducting material at selected locations along said formed portion.

9. A method as described in claim 2 further comprising the steps of applying a nonconductive cover to said transducer and said conductors prior to insertion into said recess.

10. A method as described in claim 9 further comprising the steps of:
   a. attaching a source of electrical voltage to said electrodes,
   b. maintaining said composite material with the included transducer in a poling temperature range of approximately 200° to 350° Fahrenheit (93.33° to 176.67° celsius)
   c. applying an electrical field capable of re-poling the transducer while at said temperature.

11. A method as described in claim 1, wherein said step of disposing a compensating layer comprises disposing a compensating layer on the second side of the composite material such that the compensating layer is in general alignment with the insulating layer.

12. A method as described in claim 11, wherein said step of disposing a compensating layer comprises disposing a compensating layer comprising the same material as the insulating layer.

13. A method as described in claim 11, wherein said step of disposing a compensating layer comprises disposing a compensating layer having substantially the same thickness as the insulating layer.

14. A method as described in claim 11 further comprising the step of disposing a support layer on the second side of the composite material adjacent to the compensating layer.

15. A method as described in claim 14, wherein said step of disposing a support layer comprises disposing a support layer of the same material as the compensating layer.

16. A method according to claim 15 further comprising the step of disposing a first composite plate over the first side of the composite material and the transducer and disposing a second composite plate over the compensating and support layers.

17. A method according to claim 3, wherein said attaching step comprises attaching conductors to the transducer using an adhesive conducting material applied at selected locations along the formed portions of the conductors.

* * * * *